(12) United States Patent
McTeer

(10) Patent No.: US 6,642,623 B2
(45) Date of Patent: Nov. 4, 2003

(54) MULTI-LAYERED COPPER BOND PAD FOR AN INTEGRATED CIRCUIT

(75) Inventor: Allen McTeer, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/079,858

(22) Filed: Feb. 22, 2002

(65) Prior Publication Data

US 2002/0090804 A1 Jul. 11, 2002

Related U.S. Application Data

(62) Division of application No. 09/532,087, filed on Mar. 21, 2000, now Pat. No. 6,373,137.

(51) Int. Cl.[7] .............................................. H01L 29/40
(52) U.S. Cl. ........................ 257/762; 257/763; 257/765
(58) Field of Search ................................. 257/762–765

(56) References Cited

U.S. PATENT DOCUMENTS

| | | |
|---|---|---|
| 3,755,089 A | 8/1973 | Rapids |
| 4,341,846 A | 7/1982 | Hough et al. |
| 4,910,169 A | 3/1990 | Hoshino |
| 4,987,750 A | 1/1991 | Meckler |
| 4,995,552 A | 2/1991 | Choi et al. |
| 5,021,296 A | 6/1991 | Suzuki et al. |
| 5,231,306 A | 7/1993 | Meikle et al. |
| 5,472,563 A | 12/1995 | Kogawa et al. |
| 5,518,760 A | 5/1996 | Ferrier et al. |
| 5,703,408 A | 12/1997 | Ming-Tsung et al. |
| 5,776,617 A | 7/1998 | Brady et al. |
| 5,804,908 A | 9/1998 | Yano |
| 5,939,788 A | 8/1999 | McTeer |
| 6,165,885 A | 12/2000 | Gaynes et al. |
| 6,218,302 B1 | 4/2001 | Brawckelmann et al. |
| 6,218,732 B1 * | 4/2001 | Russell et al. ............... 257/748 |
| 6,268,291 B1 * | 7/2001 | Andricacos et al. ........ 438/694 |

OTHER PUBLICATIONS

P.J. Ding, et al. "Investigation of the Mechanism Responsible for the Corrosion Resistance of B implanted Copper" Nuclear Instruments and Methods in Physics Research B 1994, pp. 260–263.

W.A. Lanford, et al. "Low–temperature Passivation of Copper by Doping with Al or Mg" Thin Solid Films 262 (1995), pp. 234–241.

* cited by examiner

Primary Examiner—Carl Whitehead, Jr.
Assistant Examiner—Thanh Nguyen
(74) Attorney, Agent, or Firm—Dickstein Shapiro Morin & Oshinsky LLP

(57) ABSTRACT

A multi layered copper bond pad for a semiconductor die which inhibits formation of copper oxide is disclosed. A small dose of titanium is implanted in the copper surface. The implanted titanium layer suppresses the copper oxide growth in the copper bond pad by controlling the concentration of vacancies available to the copper ion transport. An interconnect structure such as a wire bond or a solder ball may be attached to the copper-boron layer to connect the semiconductor die to a lead frame or circuit support structure. In another embodiment, a titanium-aluminum passivation layer for copper surfaces is also disclosed. The titanium-aluminum layer is annealed to form a titanium-aluminum-copper alloy. The anneal may be done in a nitrogen environment to form a titanium-aluminum-copper-nitrogen alloy.

14 Claims, 6 Drawing Sheets

MULTI-LAYERED COPPER BOND PAD FOR AN INTEGRATED CIRCUIT

This application is a divisional of application Ser. No. 09/532,087, filed on Mar. 21, 2000 now U.S. Pat. No. 6,373,137, which is hereby incorporated by reference.

FIELD OF THE INVENTION

The present invention relates to the field of interconnect structures for integrated circuit packages, and in particular, to a copper interconnect structure for electrically connecting two or more electronic components.

BACKGROUND OF THE INVENTION

Chip interconnection in the semiconductor processing industry often employs two steps. First, in chip bonding, the back of a chip is mechanically attached to an appropriate medium such as a ceramic substrate or a paddle of a metal lead frame. Next, the bond pads on the circuit side of the chip are electrically connected to the package leads by a wire or other electrical conductors to permit utilization of the integrated circuit (IC). Common methods for connecting the bond pads to the leads of lead frame, or the conductors of other conductor support devices, are by wire bonding, Tape Automated Bonding (TAB), Controlled Collapse Chip Connection (C4) or bump bonding, and through the use of conductive adhesives.

Aluminum bond pads are commonly employed on IC dies, but a significant problem with their use is the rapid formation of a tenacious nonconductive oxide on the surface of the metal, even at room temperature. When an interconnect is made to the bond pad, the nonconductive oxide causes the interconnect to have high contact resistance. The resistance typically ranges from hundreds to millions of ohms.

In an effort to reduce the contact resistance, a noble metal, such as gold, has been used to provide an inert, oxide-free surface on the bond pad. The presence of gold on the bond pad precludes the formation of nonconductive metal oxides at the surface of the contact. Nevertheless, the gold plating of the bond pads of a semiconductor die is an elaborate process that can be very difficult, expensive and time consuming.

Efforts have been aimed at refining the understanding of the oxidation mechanisms in metals employed in the bond pads. Recently, studies have been done on copper and copper oxide, mainly because copper has become a promising interconnect material for the next generation of integrated circuits because of high conductivity and good resistance to electromigration.

For example, W. A. Lanford studied ion implantation as an effective way to passivate copper films. Lanford, W. A. et al., *Low-temperature passivation of copper by doping with Al or Mg*, in THIN SOLID FILMS, 234–41 (1995). By analyzing the growth mechanism for copper, Lanford observed that the oxidation rate could be reduced by adding only a very small concentration of dopant, such as Al or Mg, to the copper.

Similarly, the corrosion resistance of boron (B) implanted copper, particularly its mechanism, has been studied by P. J. Ding et al. in *Investigation of the mechanism responsible for the corrosion resistance of B implanted copper*, B 85 NUCL. INSTRUM. METHODS PHYS. RES., 260–63 (1994). By investigating the oxidation of boron implanted copper and copper oxide ($Cu_2O$), Ding found that the oxidation rate of $Cu_2O$ implanted with boron is as low as that of copper metal (Cu) implanted with boron. Moreover, Ding reported that, on boron implanted copper, it is the CuO that forms, and not the $Cu_2O$ that typically forms on a non-implanted copper.

Other methods of solving the oxide problem have involved scraping the bond pad to remove oxide immediately before the interconnect is formed, or using a barrier layer on the bond pad. For example, U.S. Pat. No. 4,987,750 describes the use of titanium nitride (TiN), tungsten (W), tungsten nitride (WN), zirconium nitride (ZrN), titanium carbide (TiC), tungsten carbide (WC), tantalum (Ta), tantalum nitride (TaN), or titanium tungsten (TiW) as barrier layers for copper. Many of these materials, however, also form nonconductive oxides, or have poor electrical or thermal conductivity, or a high thermal expansion.

Further, many of these barrier layers exhibit instability at temperatures higher than 400° C. Since a silicon substrate is generally subjected to subsequent steps during the IC fabrication, such as annealing or reflow processes which require temperatures higher than 400° C., there is a need for a barrier layer that is stable at the high temperatures required for subsequent substrate processes steps. Also, since copper is increasingly used in the electrical interconnection technology, it is desirable to further improve the processes in which copper oxidation is effectively prevented, while its metallization resistance is kept low even after the substrate has undergone subsequent processing steps.

Accordingly, there is a need for an improved bond pad structure of an integrated circuit die that would not oxidize to form a nonconductive material. A copper bond pad with a suppressed oxide growth layer having good electrical conductivity, good thermal conductivity, and low thermal expansion is also needed, as well as a simple process for forming such copper bond pads.

SUMMARY OF THE INVENTION

The present invention provides an interconnect structure comprising a multi layered copper bond pad on the surface of a semiconductor die. The outermost exposed surface of the bond pad is a titanium implanted layer that protects the underlying conductive copper layer from oxidation due to exposure to ambient environmental conditions, which can lead to bonding failure, by suppressing the copper oxide growth in the bond pad. An electrical interconnect structure such as a wire or solder ball bump may be placed directly on the implanted copper layer in order to connect the copper bond pad to a lead frame or other conductive structure.

The present invention also provides for the passivation of copper surfaces by employing a Ti/Al barrier layer on the copper bond pad that enhances the bonding yield by increasing the contact adhesion between the metal layer and the bonding structure.

These and other advantages and features of the invention will be more clearly understood from the following detailed description of the invention which is provided in connection with the accompanying drawings.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, electrical and methodology changes may be made and equivalents substituted without departing from the invention. Accordingly, the following detailed description is not to be taken in a limiting sense and the scope of the present invention is defined by the appended claims.

The term "substrate" used in the following description includes any semiconductor-based structure having an exposed silicon surface in which to form the structure of this invention. The term substrate is to be understood as including silicon-on-insulator, doped and undoped silicon, epitaxial layers of silicon supported by a base semiconductor foundation, and other semiconductor structures. Furthermore, when reference is made to a substrate in the following description, previous process steps may have been utilized to form regions or junctions in or over the base semiconductor structure or foundation.

The term "bond pad" is intended to include and encompass all suitable terminal structures to which a bond may be made, including both elevated and recessed bond pads as well as flat, concave or convex bond pads and other terminal structures. As used herein, it should be understood that the term "copper" includes not only elemental copper, but copper with other trace metals or in various alloyed combinations with other metals as known in the semiconductor art, as long as such alloy is conductive.

The term "titanium" is intended to include not only elemental titanium, but titanium with other trace metals or in various alloyed combinations with other metals as known in the semiconductor art, as long as the chemical and physical properties of titanium remain unaffected.

In addition, the invention is not limited to a particular form of interconnect structure, but may be used with any interconnect structure such as conductive wires, TAB, C4 or bumps, conductive adhesives, or the like. Exemplary embodiments are illustrated as using solder bumps, which may be in the form of a solder ball, for a flip-chip arrangement, but these embodiments are only some of many examples of use of the present invention which will be apparent to one of skill in the art given the teachings herein.

Figure 1:
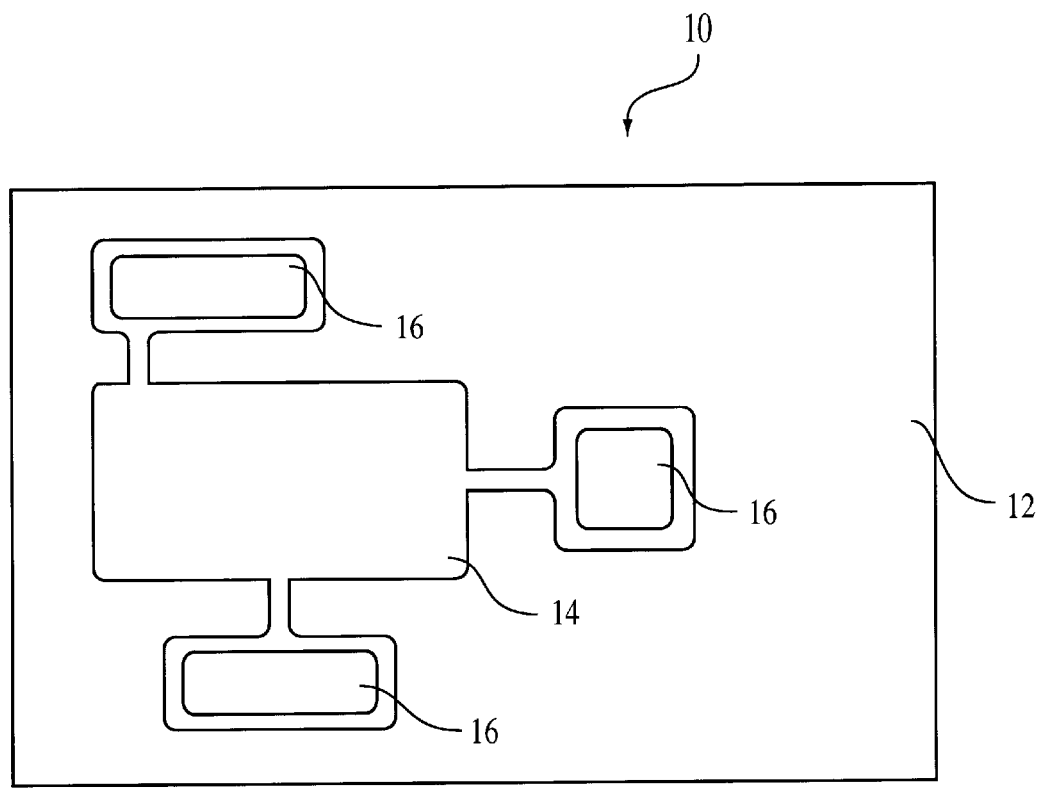
FIG. 1 is a top view of a portion of a semiconductor die, which employs an exemplary embodiment of the present invention.

Referring now to the drawings, where like elements are designated by like reference numerals, FIGS. 1–4 illustrate one embodiment of an improved copper bond pad of the present invention. FIG. 1 shows a conventional semiconductor die 10 that includes a substrate 12 on, and in, which an integrated circuit 14 has been formed. Substrate 12 is shown as a single layer in FIG. 1 for simplicity, but in fact it includes a base substrate and various material layers as needed to form an integrated circuit 14. Terminal contacts 16 are connected electrically to the internal integrated circuit. For simplicity, FIG. 1 shows only three terminal contacts. It should be apparent, however, that in actual practice there are many more terminal contacts for the integrated circuit 14.

During the manufacturing process, the die 10 is fabricated on a wafer with a large number of other dies. Each die 10 on the wafer may subsequently be singulated by saw cutting or other suitable means. As it will be described further, the upper levels of the die 10 containing an integrated circuit 14 contain a passivation layer 28 and an oxide layer 30 (FIG. 2), over an upper metal, here copper, layer 26. A via is formed in layers 28 and 30 down to copper layer 26 in which an electrical structure 50 is deposited to form an electrical contact. The area of the copper layer to which metal 50 connects is the copper bond pad. The passivation layer 28 may be silicon dioxide, silicon nitride, a polyimide, or other material suitable for protecting the integrated circuit 14.

Figure 2:
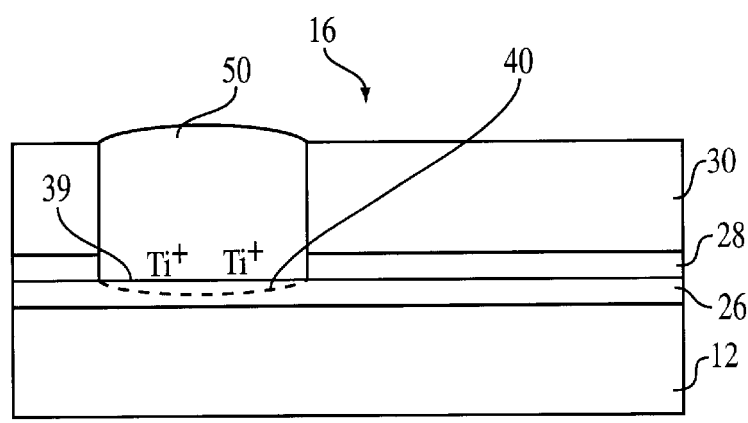
FIG. 2 is a cross-sectional view of the semiconductor die of FIG. 1.

Referring now to FIG. 2, the terminal contacts 16 and underlying copper bond pads 39 are typically polygonal (e.g., square), about 100 microns on a side. The bond pads 39 comprise a conductive layer 26 of copper and a titanium implanted layer 40 located within the copper conductive layer 26. The conductive copper layer may be of any suitable thickness, for example, approximately 500 to 12,000 Å thick. The electrical interconnect structure 50, may be fabricated as a bump, wire, conductive adhesive, or tape and is located on the titanium implanted layer 40.

Figure 3:
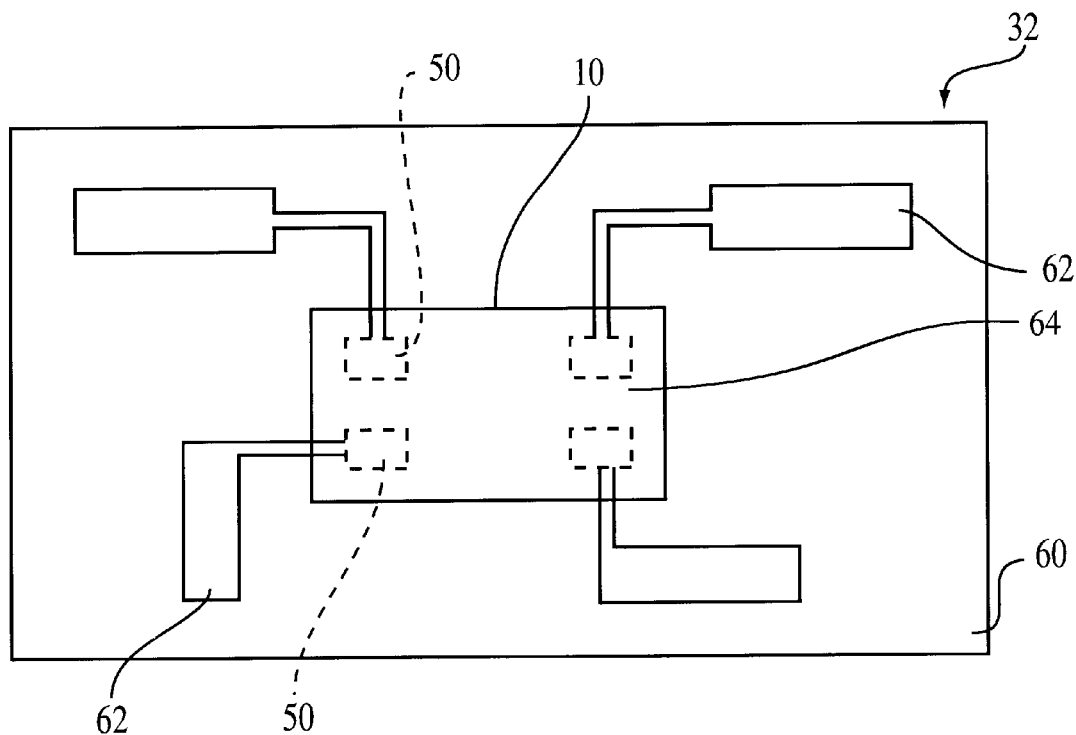
FIG. 3 is a top view of an integrated circuit package containing the semiconductor die of FIG. 1 electrically connected to a circuit substrate.
Figure 4:
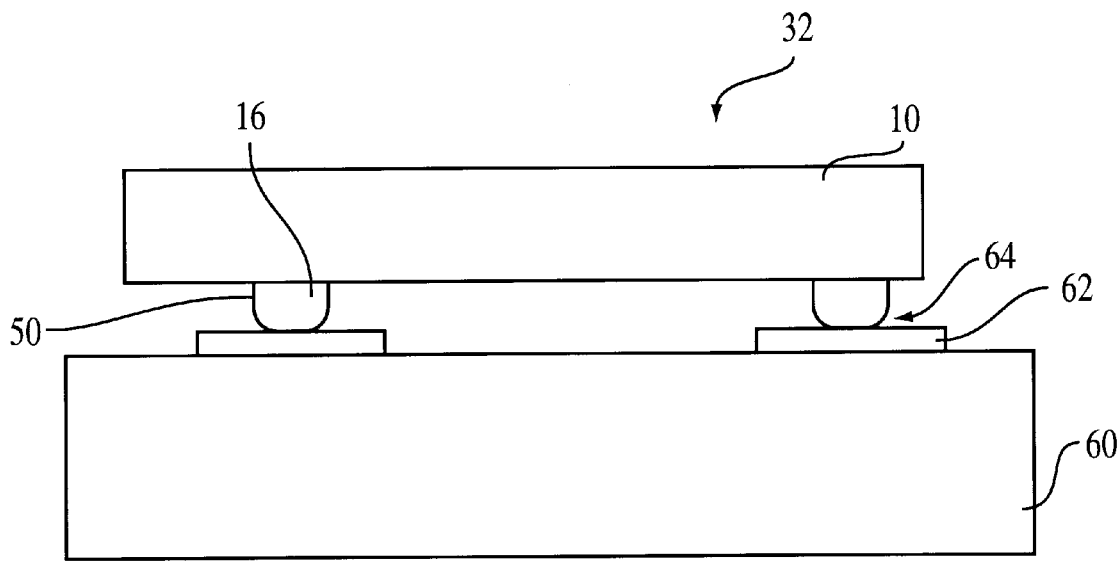
FIG. 4 is a cross-sectional view of the integrated circuit package of FIG. 3.

FIGS. 3 and 4 illustrate the interconnection between the semiconductor die 10 and a circuit substrate 60. The circuit substrate 60 may be a lead frame, chip carrier, or other support structure which, in connection with the die 10, produces a complete IC package 32. A surface circuit trace 62 on the circuit substrate 60 defines a die mounting site 64. During packaging, an electrical connection is formed between the die 10 and the circuit substrate 60 by placing the die 10 onto the circuit substrate 60, at the mounting site 64 so that each electrical interconnect structure 50 of the die comes in contact with a respective bond side of a circuit trace 62, as shown in FIG. 4.

The titanium implanted film 40 is manufactured through a process described as follows, and illustrated by FIGS. 5 through 7. The fabrication process for the titanium implanted layer begins subsequent to the formation of integrated circuitry on a semiconductor die 10, and is carried out at the final metalization stages of IC fabrication.

Figure 5:
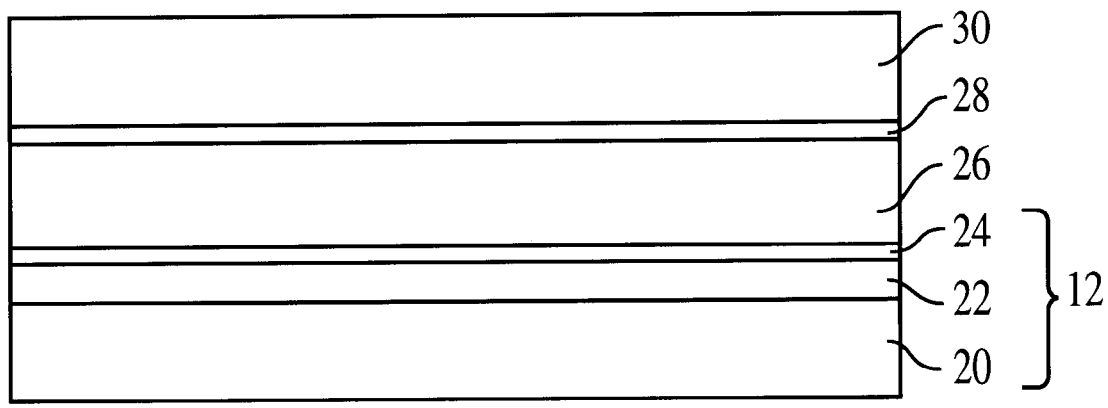
FIG. 5 is a cross-sectional view of a semiconductor die with a copper bond pad according to a first embodiment of the present invention at an intermediate stage of processing.

FIG. 5 illustrates the last few layers of an integrated circuit structure. A dielectric layer 22 of insulating material is formed on substrate surface 20, in and on which various integrated circuit structures have been fabricated. The insulating material can be, for example, phosphosilicate glass (PSG), borophosphosilicate glass (BPSG), silicon oxide, silicon nitride, or silicon oxynitride, among others.

As further illustrated in FIG. 5, a barrier layer 24 is formed over the dielectric layer 22. The barrier layer 24 may be, for example, tantalum (Ta), tantalum nitride (TaN), tungsten nitride (WN), tungsten (W), titanium nitride (TiN), titanium tungsten (TiW). For simplicity, layers 20, 22, and 24 are collectively named and designated as a support layer 12, as illustrated in FIGS. 6–7 and FIGS. 9–12. Also shown in FIG. 5, a copper bond layer 26 is applied over the barrier layer 24, which is part of the support layer 12. The bond pad layer 26 is connected to one or more portions of the fabricated integrated circuit 14. The barrier layer 24, which is preferably a refractory nitride layer, is utilized to prevent copper from diffusing into the underlying layers of the fabricated structure.

The copper bond layer 26 can have a thickness in the range of about 500 Å to 20,000 Å, preferably of about 10,000 Å. An insulating layer or passivation layer 28 is further deposited on top of copper layer 26. The passivation layer may have a thickness in the range of about 1,000 Å to 20,000 Å, preferably of about 4,000 Å. The passivation layer can be silicon oxide, oxynitride, silicon nitride, borophosphosilicate glass, or polyimide.

On top of the passivation layer 28, a non-conductive oxide or other insulating film layer 30 can be further applied (shown in FIG. 5). The oxide layer 30 can be, for example, TEOS. The passivation layer 28 and the oxide layer 30 protect the IC structures below from chemical action, corrosion, and handling impacts.

The passivation layer 28 and the oxide layer 30 are formed as a blanket across the surface of the wafer, and conventional techniques are then used to define the bond pads 16 (FIG. 7) by selectively removing the passivation layer 28 and the oxide layer 30 forming vias to copper layer 26.

Figure 6:
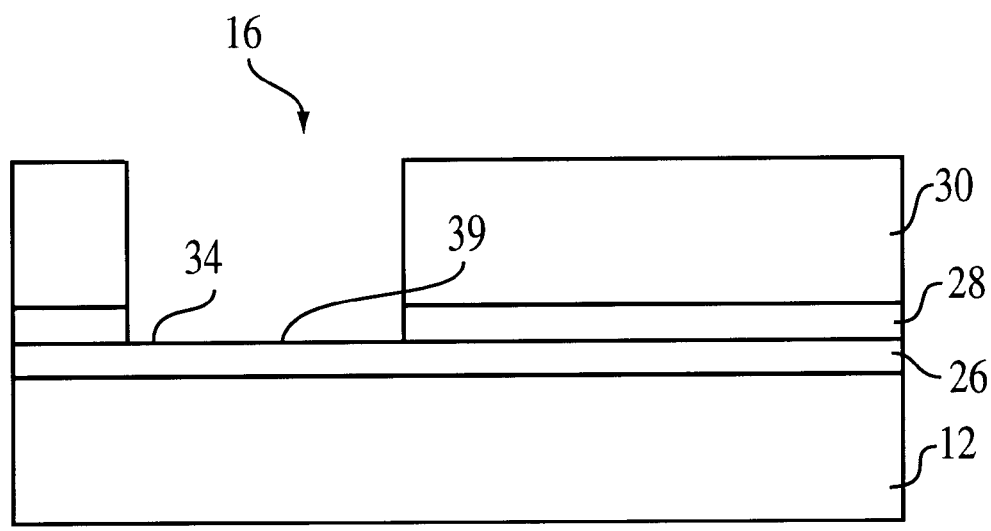
FIG. 6 is a cross-sectional view of a semiconductor die with a copper bond pad according to the present invention at a stage of processing subsequent to that shown in FIG. 5.

Referring now to FIG. 6, the passivation layer 28 and the oxide layer 30 are further patterned and etched according to conventional techniques. This way, at least one via 32 is formed over an exposed surface 34 of copper layer 26 forming bond site 39. The copper bond surface 34 is typically square and has dimensions on the order of 100×100 microns.

In practice, a plurality of bond pads are disposed on the top surface of the die, so that a plurality of input/output connections can be made later with the die. Although only one bonding copper bond pad 39 is shown in FIG. 7, it will be readily apparent to those skilled in the art that in fact any number of such bonding copper pads 39 are formed in the terminal contact 16.

Figure 7:
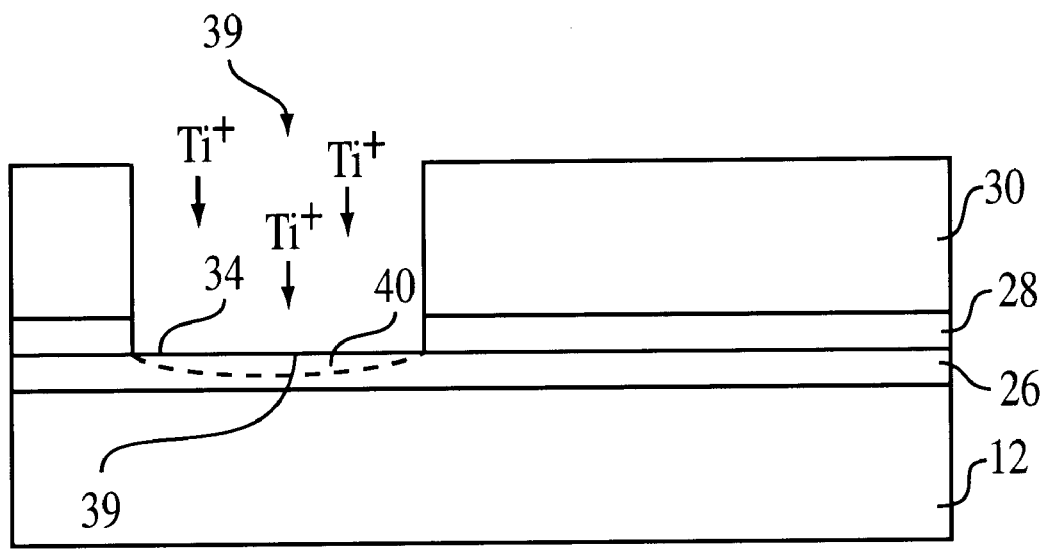
FIG. 7 is a cross-sectional view of a semiconductor die with a copper bond pad according to the present invention at a stage of processing subsequent to that shown in FIG. 6.

As shown in FIG. 7, once via 32 has been formed and the copper bond pad surface 34 has been exposed, the implantation of titanium and the passivation of copper layer 26 follow. Any known ion implantation technique, such as selective implantation for example, can be used for titanium implantation.

As known in the art, the process conditions for ion implantation vary from tool to tool. A typical example is implantation with 50 keV $Ti^+$ with a dosage of $5 \times 10^{15}/cm^2$.

While the process conditions for titanium implantation are not critical, it is important, however, that the implant dose modify only the near surface of the copper so that the side effects of the implantation, both on the metal itself and on other parts of the device, be minimal. For this, $Ti^+$ must advance into the copper layer 26 through the copper surface 34 to a predetermined thickness, not to exceed 1000 Å, of approximately 50 Å to 200 Å. This is because at high ion concentrations the oxide layer 30 may become conductive and may impede further the production of the integrated circuit. To further facilitate the implantation of titanium into the copper surface, the wafer may be cleaned or pretreated before the implantation step is performed. Thus, if an in-situ cleaning technique is used, a noble gas, such as argon or neon, is used to clean off any copper oxide on the copper surface prior to the deposition. Alternatively, an ex-situ technique, such as a wet chemical etch, may be used for the pretreatment of the wafer prior to the implantation of titanium.

Figure 8:
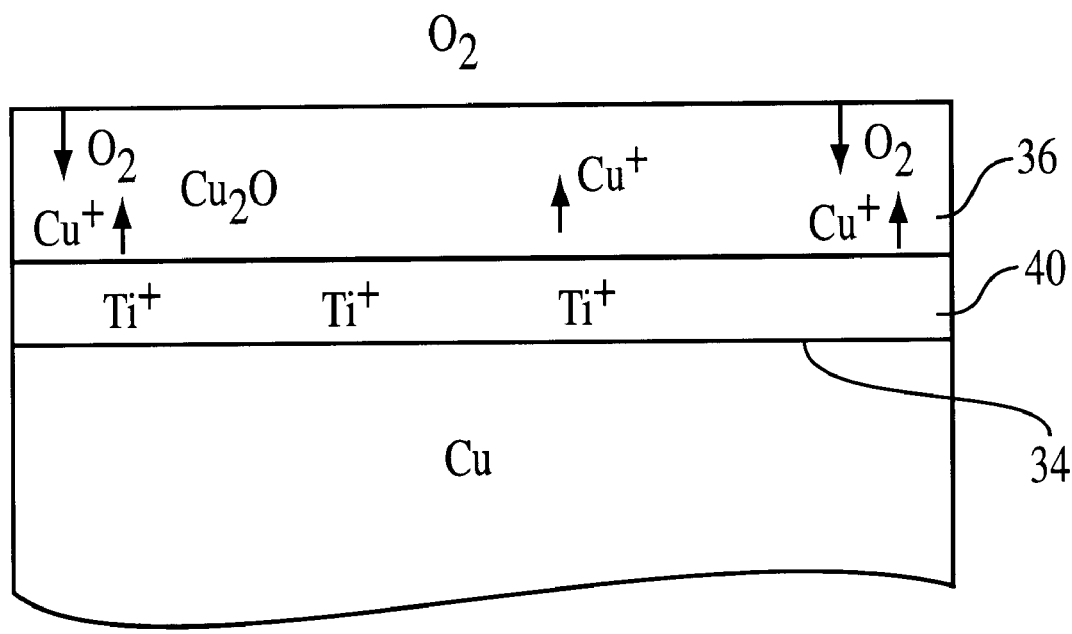
FIG. 8 is a schematic representation of how copper oxidizes in air.

Reference is now made to FIG. 8, which demonstrates schematically how copper oxidizes in air and how the copper oxidation is controlled by blocking the transport of $Cu^+$ by the titanium implantation. The copper oxide $Cu_2O$ film 36 grows because $Cu^+$ ions from the copper pad surface 34 are transported through the growing oxide $Cu_2O$ and are later combined with oxygen at the oxide/air interface. The implanted $Ti^+$ film 40 shown in FIG. 8 prevents $Cu^+$ atoms from diffusing through $Cu_2O$ oxide 36 to air interface. The oxide film 36 is a result of the formation of the native oxide $Cu_2O$ on copper bond surface 34. In contact with oxygen, titanium forms a titanium oxide (TiOx) which is stable under normal conditions. The titanium oxide (TiOx) further prevents the diffusion of $Cu^+$ atoms and oxygen atoms that can create a copper oxide (CuOx). Without the ability of the $Cu^+$ atoms to diffuse through layer 36, additional oxide cannot form and the native $Cu_2O$ oxide growth is suppressed to less than 300 Å.

Subsequent to the implantation process, an electrical interconnect structure 50, such as a bump, wire, conductive adhesive, or tape may be formed by conventional means on the $Ti^+$ implanted layer 40 to connect the bond pads 39 to external terminals and the die 10 packaged to form a complete IC package 32.

Figure 9:
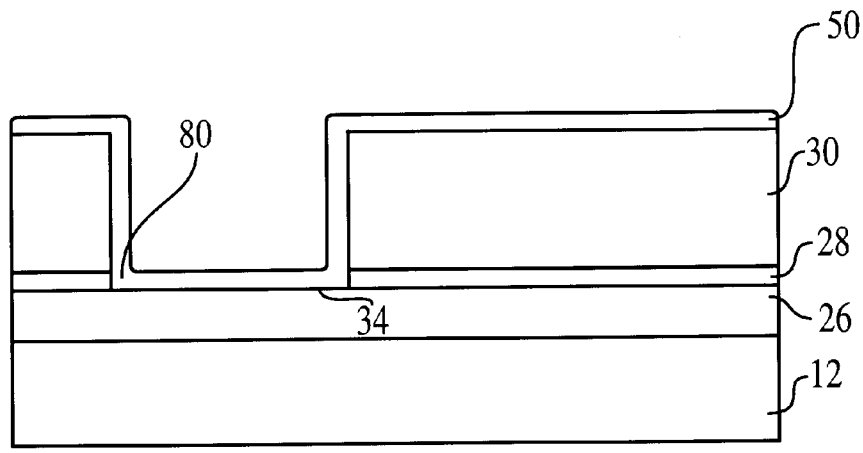
FIG. 9 is a cross-sectional view of a semiconductor die with a copper bond pad according to a second embodiment of the present invention at an intermediate stage of the processing.

In another embodiment of the present invention, the copper bond pad surface is passivated by employing a titanium-aluminum (TiAl) barrier layer. FIGS. 9–12 illustrate a second embodiment of an improved copper bond structure of the present invention. FIG. 9 shows a thin barrier layer of titanium aluminum (TiAl) 80 deposited within via 32 and onto the copper bond surface 34. Titanium-aluminum layer 80 can be deposited by sputtering, using a DC or RF sputtering system. It must be noted, however, that other techniques such as evaporation, CVD, or plating may also be used. The thickness of the titanium aluminum layer 80 is of approximately 50 Å to 200 Å. Also, as it was explained above with reference to the first embodiment, prior to the formation of the TiAl barrier layer, the wafer may be pretreated or cleaned by using either an in-situ or an ex-situ cleaning technique to sputter off any copper oxide formed on the copper surface of the wafer.

Figure 10:
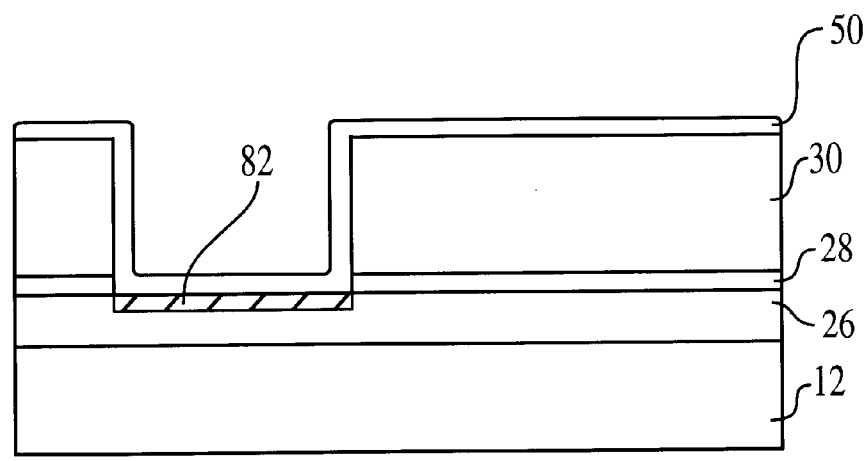
FIG. 10 is a cross-sectional view of a semiconductor die with a copper bond pad according to the present invention at a stage of processing subsequent to that shown in FIG. 9.

Next, as shown in FIG. 10, the thin TiAl layer 80 is annealed in an argon or nitrogen atmosphere, at a temperature in the range of 300° C. to 400° C., for about 2 minutes. The annealing causes the titanium-aluminum layer and the copper to form a titanium-aluminum-copper ($Ti_xAl_yCu_z$) compound or alloy, where x, y, and z could be the same or different, at the junction between the copper and the TiAl barrier layer, as depicted by diffusion layer 82 of FIG. 10.

Figure 11:
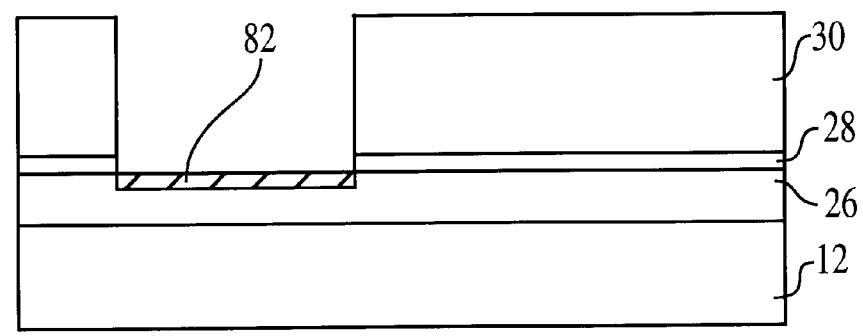
FIG. 11 is a cross-sectional view of a semiconductor die with a copper bond pad according to the present invention at a stage of processing subsequent to that shown in FIG. 10.
Figure 12:
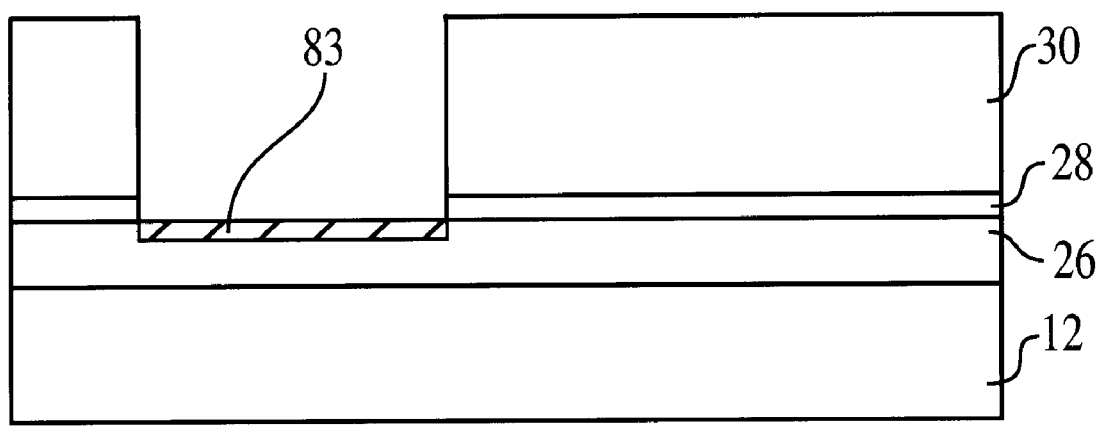
FIG. 12 is a cross-sectional view of a semiconductor die with a copper bond pad according to the present invention at a stage of processing subsequent to that shown in FIG. 11.

Referring now to FIG. 11, the unreacted portion of the TiAl layer, that is the portion of layer 80 overlying diffusion layer 82, is next stripped away from the diffusion layer 82 by means of CMP, a wet etch process, or even a dry etch process. The remaining layer 82 could be further annealed in an $NH_3$ ambient, in a rapid thermal anneal (RTA) chamber, at a temperature of approximately 350° C. to 550° C., so to form a Ti—Al—N compound. The formation of this compound is achieved in approximately 5 minutes. This way, the second anneal step transforms layer 82 of FIG. 11 into a nitrogen containing layer 83 of FIG. 12. The new nitrogen-containing layer 83 is more effective as a diffusion barrier than the titanium-aluminum-copper layer 82. The surface alloying of the copper with the titanium and aluminum retains the low resistivity of the copper, while affording passivation of copper surfaces.

Next, an electrical interconnect structure 50, such as a bump, wire, conductive adhesive or tape, may be formed by conventional means on the nitrogen-containing titanium-aluminum-copper layer 83, to connect the bond pads to external terminals and the die 10 packaged to form a complete IC package 32.

The above description illustrates preferred embodiments which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A copper bond pad for a semiconductor device, said bond pad comprising:
   a dielectric layer formed over a substrate of said semiconductor device;
   a barrier layer formed over said dielectric layer;
   a copper layer formed over said barrier layer, said copper layer having an upper surface implanted with titanium;
   a passivation layer formed over said copper layer, wherein said passivation layer is formed of a material selected from the group consisting of silicon oxide, oxynitride, silicon nitride, borophosphosilicate glass and polyimide;
   an insulating layer over said passivation layer; and
   a via formed in said insulating layer and said passivation layer, said via exposing a portion of said copper layer and defining said bonding pad area.

2. The copper bond pad of claim 1, wherein said insulating layer further comprises an oxide layer over said insulating layer.

3. The copper bond pad of claim 1, wherein said dielectric layer is formed of a material selected from the group consisting of phosphosilicate glass, borophosphosilicate glass, silicon oxide, silicon nitride, and silicon oxynitride.

4. The copper bond pad of claim 1, wherein said barrier layer is formed of a material selected from the group consisting of silicon nitride, titanium nitride, titanium tungsten, tantalum, tantalum nitride, a metal, a nitride, and a polycide.

5. The copper bond pad of claim 1, wherein said insulating layer is formed of a material selected from the group consisting of silicon nitride, silicon oxynitride, silicon oxide, phosphosilicate glass, borophosphosilicate glass, and a polyimide.

6. A copper bond pad for a semiconductor device, said bond pad comprising:
   a dielectric layer formed over a substrate of said semiconductor device;
   a barrier layer formed over said dielectric layer;
   a copper layer formed over said barrier layer, said copper layer having a titanium-aluminum layer formed over at least an upper surface portion of said copper layer; and
   an insulating layer over said copper layer having a via defining said bond pad.

7. The copper bond pad of claim 6, wherein said insulating layer further comprises an oxide layer over said insulating layer.

8. The copper bond pad of claim 6, wherein said dielectric layer is formed of a material selected from the group consisting of phosphosilicate glass, borophosphosilicate glass, silicon oxide, silicon nitride, and silicon oxynitride.

9. The copper bond pad of claim 6, wherein said barrier layer is formed of a material selected from the group consisting of tantalum, tantalum nitride, tungsten, tungsten nitride, titanium nitride, titanium tungsten, a metal, a nitride, and a polycide.

10. The copper bond pad of claim 6, wherein said insulating layer is formed of a material selected from the group consisting of silicon nitride, silicon oxynitride, silicon oxide, phosphosilicate glass, borophosphosilicate glass, and a polyimide.

11. The copper bond pad of claim 6, wherein said titanium-aluminum layer is approximately 50 Å to 200 Å thick.

12. The copper bond pad of claim 6, wherein said titanium-aluminum barrier layer is annealed to form a titanium-aluminum-copper alloy.

13. The copper bond pad of claim 12, wherein said titanium-aluminum-copper alloy is annealed in the presence of nitrogen to form a titanium-aluminum-nitrogen compound.

14. The copper bond pad of claim 6, wherein said upper surface portion of said copper layer is precleaned.

* * * * *